United States Patent
Schrattenecker et al.

(10) Patent No.: US 10,771,087 B2
(45) Date of Patent: *Sep. 8, 2020

(54) METHODS, DEVICES AND SYSTEMS FOR DATA CONVERSION

(71) Applicant: Infineon Technologies AG, Neubiberg (DE)

(72) Inventors: Jochen O. Schrattenecker, Reichenthal (AT); Peter Bogner, Wernberg (AT); Andrea Cristofoli, Villach (AT); Michael Kropfitsch, Koettmannsdorf (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/424,984

(22) Filed: May 29, 2019

(65) Prior Publication Data

US 2019/0386673 A1 Dec. 19, 2019

(30) Foreign Application Priority Data

Jun. 13, 2018 (DE) .......................... 10 2018 114 091

(51) Int. Cl.
*H03M 1/84* (2006.01)
*H03M 1/10* (2006.01)
*H03M 1/46* (2006.01)
*H03M 1/36* (2006.01)

(52) U.S. Cl.
CPC ........... *H03M 1/84* (2013.01); *H03M 1/1033* (2013.01); *H03M 1/367* (2013.01); *H03M 1/464* (2013.01)

(58) Field of Classification Search
CPC ...... H03M 1/84; H03M 1/1033; H03M 1/464; H03M 1/367
USPC .................................................. 341/118–155
See application file for complete search history.

(56) References Cited

U.S. PATENT DOCUMENTS

| | | | | |
|---|---|---|---|---|
| 5,900,904 | A * | 5/1999 | Okada | H04N 7/17318 348/E7.071 |
| 6,462,684 | B1 * | 10/2002 | Medelius | H03M 1/004 341/120 |
| 7,710,303 | B2 | 5/2010 | Wojewoda et al. | |
| 9,281,832 | B1 * | 3/2016 | Thiagarajan | H03M 1/127 |
| 9,774,337 | B1 * | 9/2017 | Chao | H03M 1/125 |
| 2006/0211044 | A1 * | 9/2006 | Green | B01J 19/0046 435/7.1 |
| 2008/0239939 | A1 * | 10/2008 | Parnaby | H04B 3/23 370/201 |
| 2016/0182073 | A1 | 6/2016 | Speir et al. | |
| 2017/0045578 | A1 | 2/2017 | Okuda et al. | |
| 2017/0127089 | A1 * | 5/2017 | Shi | G10L 19/0212 |
| 2019/0383651 | A1 * | 12/2019 | Bogner | G01D 18/008 |

\* cited by examiner

*Primary Examiner* — Lam T Mai
(74) *Attorney, Agent, or Firm* — Slater Matsil, LLP (57) ABSTRACT

In accordance with an embodiment, a method of monitoring a data converter includes determining a multiplicity of time-associated linearity parameters that describe a linearity of the data converter at a multiplicity of different times, and determining a state of the data converter based on comparing at least one linearity parameter of the multiplicity of time-associated linearity parameters with a comparison parameter.

20 Claims, 5 Drawing Sheets

METHODS, DEVICES AND SYSTEMS FOR DATA CONVERSION

This application claims the benefit of German Application No. 102018114091.6, filed on Jun. 13, 2018, which application is hereby incorporated herein by reference in its entirety.

TECHNICAL FIELD

This disclosure relates generally to methods, devices and systems for data conversion.

BACKGROUND

Data converters for transforming signals are used in a variety of ways, for example in electronic circuits.

Data converters are understood to mean devices designed to convert a first signal, which has a first signal format, into a second signal, which has a second signal format. By way of example, an optical signal can be converted into an electronic signal, or vice versa.

Examples of data converters are in particular analog-to-digital converters, which convert an analog signal into a digital signal, and digital-to-analog converters, which convert a digital signal into an analog signal. In many applications, it is necessary and/or useful to perform a calibration of data converters. The aim of such a calibration can be, by way of example, for the conversion of the data to satisfy specific requirements, for example to have a sufficiently linear characteristic. By means of a calibration, it may thus be possible, by way of example, for signals generated by means of a nonlinear data conversion to be linearized by means of a subsequent correction. Such linearization can be performed by means of correction terms, wherein the correction terms can be determined in the context of the calibration. In the case of many data converters, a calibration is carried out once at the factory. In addition, it may be possible for data converters to be calibrated or recalibrated not only at the factory but also during operation, for example by means of suitable calibration methods.

In many applications, a transfer characteristic of the data converter is determined. Such a transfer characteristic describes how an input signal is converted into an output signal by the data converter. A transfer characteristic can change on account of a calibration. Depending on the field of use of the data converter, various requirements may be made in respect of the transfer characteristic. By way of example, for some applications it may be desirable for the transfer characteristic to have a sufficiently linear behavior, that is to say for there to be a linear relationship between the input signal and the output signal over the entire dynamic range of the data converter, or at least in a specific operating range of the data converter.

The transfer characteristic of a data converter may be dependent on design parameters chosen, for example what type of data converter is used and how components are designed. These types of dependencies can be ascertained by means of simulation, laboratory characterization, or by means of automated test equipment (ATE), before the delivery of the data converter. However, the transfer characteristic may also be dependent on further influences which cannot be determined before delivery, for example because there is a dependence on environmental parameters, or because the transfer characteristic changes over time, for example on account of aging processes. For specified operating conditions, a manufacturer usually assures a transfer characteristic in a specific tolerance range, e.g. in the form of a maximum deviation from a linear behavior. Data converters may be subject to aging/degradation processes that can lead to impairment of their characteristic and ultimately to their failure. Data converters can also fail randomly, for example suddenly.

SUMMARY

In accordance with one exemplary embodiment, a method for monitoring a data converter is provided.

The method comprises determining a multiplicity of time-associated linearity parameters, describing a linearity of the data converter, at a multiplicity of different times.

Furthermore, the method comprises determining a state of the data converter on the basis of comparing at least one linearity parameter of the multiplicity of time-associated linearity parameters with a comparison parameter.

In accordance with a further exemplary embodiment, a device for data conversion is provided.

Said device comprises a data converter, a test signal circuit and a monitoring circuit.

The test signal circuit is designed to determine a multiplicity of time-associated linearity parameters, describing a linearity of the data converter, at a multiplicity of different times. The monitoring circuit is configured to determine a state of the data converter on the basis of comparing at least one linearity parameter of the multiplicity of time-associated linearity parameters with a comparison parameter.

DETAILED DESCRIPTION OF ILLUSTRATIVE EMBODIMENTS

Various exemplary embodiments are described in detail below with reference to the accompanying drawings. These exemplary embodiments should be considered merely to be an example and should not be regarded as limiting. By way of example, in other exemplary embodiments, some of the features or components described can be omitted and/or replaced by alternative features or components. Features or components of different exemplary embodiments can be combined in order to form further exemplary embodiments.

Variations and modifications described with respect to one exemplary embodiment can also be applied to other exemplary embodiments. Furthermore, features or components other than those described or shown can be provided, for example features or components used in conventional data converters, in particular analog-to-digital converter circuits or digital-to-analog converter circuits.

Direct connections or couplings shown in the drawings or described below, i.e. electrical connections or couplings without intervening elements (for example simple metal conductor tracks), can also be realized by an indirect connection or coupling, i.e. a connection or coupling comprising one or more additional intervening elements, and vice versa, as long as the general functioning of the connection or coupling, for example providing a voltage, providing a current, guiding an electromagnetic wave or providing a control signal, is substantially maintained.

The methods described above and below can also be stored, for control by means of a computer, as instructions on a materially existent storage medium, for example as instructions for a monitoring circuit 103 described below, for example in firmware. The monitoring circuit can be implemented on a PC comprising a memory and a processor, but also as a hardwired logic, an ASIC or some other embodiment. A memory here should generally be understood to mean a device in which data can be stored. Such a memory can comprise e.g. a random access memory (RAM), a read only memory (ROM), a flash memory, an EPROM, an EEPROM and/or fuses such as electrical fuses or laser fuses. Such fuses can be conductive or nonconductive and thus likewise store data.

In the figures, identical reference signs designate identical or similar elements. The figures are schematic representations of various exemplary embodiments. Elements illustrated in the figures are not necessarily illustrated in a manner true to scale. Rather, the different elements illustrated in the figures are reproduced in such a way that their function and general purpose become comprehensible to the person skilled in the art.

Numerical values mentioned in association with exemplary embodiments serve merely for explanation purposes. Numerical values should not be interpreted as limiting and are dependent on the choice of parameters and a respective implementation.

Some data converters have a calibration in order to operate in a well-defined manner and/or to have a desired behavior. By way of example, a calibration can be used to compensate for a design-dictated nonlinear behavior of a data converter by means of the converted signals being scaled e.g. depending on a calibration in order to obtain a linear behavior. Moreover, a calibration can take account of a change in properties of the data converter depending on the ambient conditions and can at least partly compensate therefor, thus resulting in a desired transfer characteristic.

By way of example, the properties of data converters, in particular linearity properties of data converters, can change on account of variable parameters, for example a fluctuation of the process, the supply voltage present and/or the temperature (referred to as "PVT variation"), and on account of aging processes.

Calibration of a data converter is thus understood to mean a process that involves determining values of calibration parameters which can form the basis for the conversion of the data by the data converter.

A calibration can be effected for example at the factory by means of a known test signal provided as input signal to the data converter. By way of example, production tolerances can be compensated for by means of such calibrations.

In addition, a linearity parameter is measured. For this purpose, a test signal is applied. The data converter performs a conversion of the test signal and supplies an output signal. One linearity parameter (or a plurality of linearity parameters) can be determined by means of a comparison of the detected output signal with a desired output signal.

The linearity parameter quantifies the extent to which the transfer characteristic of the data converter deviates from an ideal linear transfer characteristic. This can be implemented for example in the form of integral non-linearity, INL, and/or in the form of differential non-linearity, DNL.

Alternatively or supplementarily, further linearity parameters can also be determined, for example offset error, gain error or missing bit positions (referred to as: missing codes). The methods described above and below can correspondingly be applied to these or other linearity parameters.

Such or similar values can be quantified differently depending on the type of data converter. In the case of analog-to-digital converters, it is possible to specify DNL values for example in the form of counts of a digital output signal of the analog-to-digital converter. In an ideal analog-to-digital converter having n bits, each stage of the transfer characteristic can have a width of $Uref/2^n$, wherein Uref is the reference voltage and can thus specify the dynamic range of the analog-to-digital converter. The DNL can correspond to the absolute value of the deviation of the respective stage width from the setpoint value.

The INL can describe the deviation of the transfer characteristic overall from a linear profile. There are various ways of ascertaining the INL. By way of example, the INL can be ascertained from the absolute value of the sum of the respective DNLs or can be ascertained computationally by means of regression lines over the measured transfer characteristic.

It is possible to determine further parameters describing a deviation of the transfer characteristic from an ideal linear transfer characteristic, for example offset and full excursion errors. Such parameters are also linearity parameters within the meaning of this application since they quantify the linearity.

If the properties of a data converter change, for example over time, for example on account of aging processes and/or on account of changes in the ambient conditions, this can be ascertained in some exemplary embodiments by virtue of values of linearity parameters being compared with a comparison parameter. Such a comparison parameter can comprise for example one threshold value or a plurality of threshold values.

In some exemplary embodiments, this can have the advantage that it may be possible to observe the state, for example the aging state, of the analog-to-digital converter in order to be able to react to or anticipate a failure of the analog-to-digital converter.

A time is understood to mean a specific time. This can be a time which is crucial for a process, for example a calibration; by way of example, it can be a time stamp indicating a time at which the process was concluded or begun, for example the time at which a calibration was concluded.

Thus, in exemplary embodiments, linearity parameters are determined at different times. Linearity parameters can take account of ambient parameters at the respective times, for example by means of a normalization. Determining the linearity parameters can be carried out at regular, i.e. periodic, or irregular time intervals.

When determining the linearity parameters at regular time intervals, the determining is carried out at times that are substantially, for example in a manner limited by method-dictated inaccuracies in the time determination, at fixed intervals with respect to one another. By way of example, this can be ensured by a counter having a defined counting rate, wherein the counter is reset when a predefined value is attained, and determining is effected. Many alternative possibilities for realizing a periodic time interval are known to the person skilled in the art.

The determining can also be carried out continuously, that is to say that a device carries out renewed determining as soon as previous determining has been concluded. In this case, the duration of a determination step predefines the time at which the subsequent determining begins. It may thus be possible for the frequency of determining to change depending on external parameters, for example the temperature.

The determining can also be carried out at random times. For this purpose, a random number generator can be used in order to bring about a decision as to whether or not determining is intended to be effected. This can have the advantage that the determining can be less susceptible to periodic (disturbance) influences, for example electromagnetic signals having a specific frequency that are present in the surroundings.

The determining can also be carried out at irregular time intervals by virtue of determining being effected depending on external conditions, for example depending on ambient parameters, e.g. temperature or voltage supply, or depending on internal conditions or depending on operating scenarios, for example depending on switching on of a device used or a received signal. By way of example, a calibration can be initiated by the processor, for example when the device is started up. It may also be possible for a calibration—and thus also determining—to be initiated by a user.

In accordance with various exemplary embodiments, the state of the data converter, for example the linearity behavior of a data converter, can be deduced by comparing linearity parameters determined at different times. In this case, therefore, the comparison parameter described above is not a fixed threshold value, but rather a linearity parameter determined at a different time.

In this case, the comparing can be carried out in various ways. As an alternative and/or in addition to the threshold values mentioned above, in some exemplary embodiments, it is thus possible for one linearity parameter to be compared with a further linearity parameter in order to determine the state of the data converter. However, more complex comparisons, based on a plurality of linearity parameters, are also possible. A comparison can comprise determining one or more order relations, that is to say for example "equal to", "greater than", "less than". The comparing can also comprise determining one or a plurality of differences between values. In this case, a difference can be expressed for example as a difference or quotient of values of one or more linearity parameters, but other methods of apportionment are also possible.

The comparing can also take account of the time that has elapsed between determining the linearity parameters; by way of example, a gradient or an integral of the values can be produced, for example a numerical gradient. One gradient or a plurality of gradients, integrals, etc., can be determined quantitatively as a difference. The comparing can also comprise the analysis of a multiplicity of time-associated linearity parameters for a multiplicity of times. This can be done using customary methods such as are known from curve discussion and filter development, for example.

A result of the comparing can be a qualitative statement, for example a logical statement such as "values are equal", "value 1 is greater than value 2", "value 1 is less than value 2", wherein "value" relates to values of one or more calibration parameters of the calibration data sets. The result can also be a quantitative statement, for example a difference between the values with or without an arithmetic sign, or a gradient that takes account of the difference between the values over time.

The state of a data converter in accordance with various exemplary embodiments is a qualitative and/or quantitative description of the data converter, in particular in respect of its linearity properties and/or usability. The state of a data converter can comprise a measure of an aging or degradation state. A degradation state indicates how far aging or some other degradation of the data converter has advanced. In this case, a degradation state allows the usability of the data converter to be deduced quantitatively. Furthermore, it may be possible to produce a forecast for the further usability of the data converter on the basis of empirical values.

Thus, in such exemplary embodiments, the state of a data converter is described by means of the linearity parameters of the data converter.

The state of the data converter can be derived from the linearity parameters. Measure of a linearity behavior is understood to mean that this measure qualitatively and/or quantitatively reveals whether and to what extent a degradation state is present. By way of example, the state can comprise one item of logical information such as "in order", "not in order". The measure can also comprise a multiplicity of items of logical information, for example "assembly 1 in order", "assembly 2 not in order", etc.

By way of example, the state can also comprise quantitative information, such as a "life state indication". The latter can be based on a model of a life expectancy for a component part, and can be determined for example by means of a correlation of measurement data of the device with representative data enabling the device to be assigned to a failure distribution. By way of example, it is possible to provide one percentage as a measure, for example "health: 85%", or a plurality of percentages characterizing different properties, for example "assembly 1 health: 99%, assembly 2 health: 20%". It may also be possible for the measure to comprise both qualitative and quantitative degradation information, for example "assembly 1 health: 99%, assembly 1 in order, assembly 2 health: 20%, assembly 2 not in order".

Figure 1A:
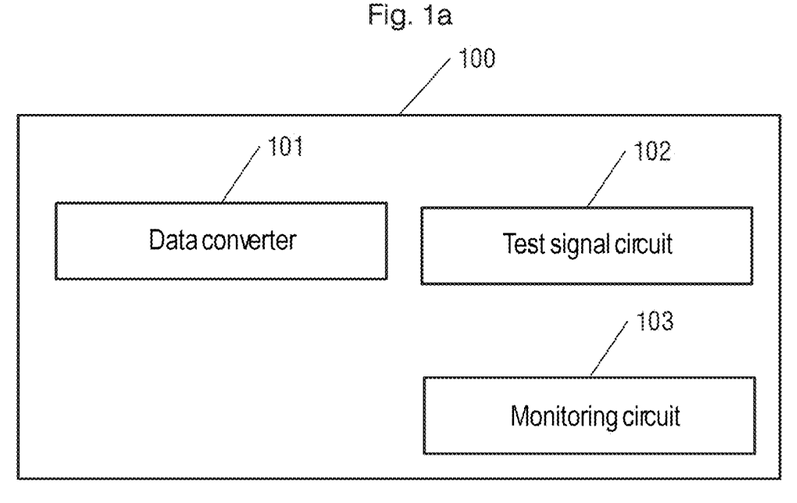
FIG. 1a shows a device for data conversion in accordance with various exemplary embodiments.
Figure 1B:
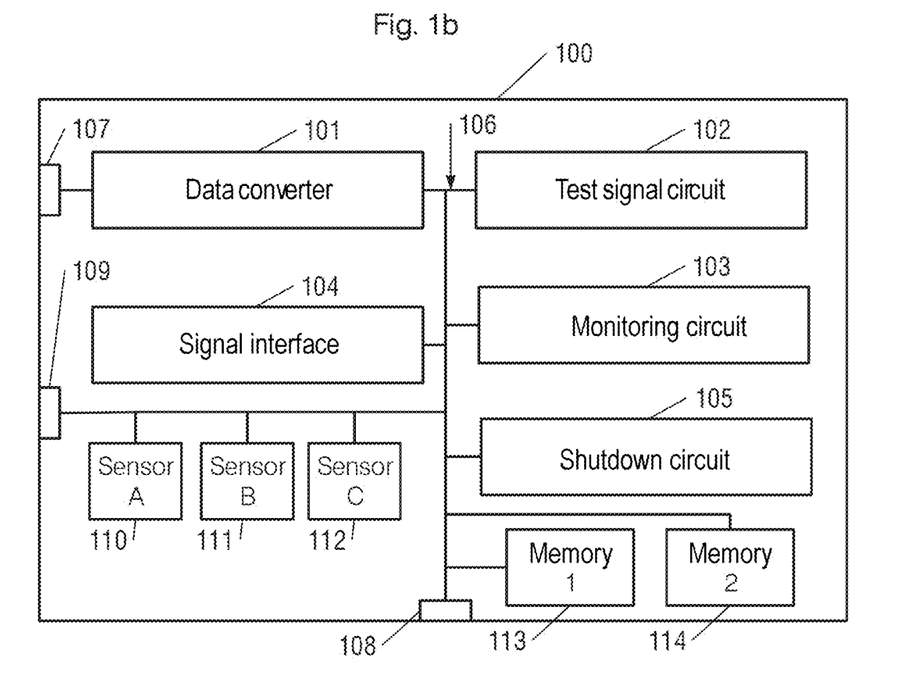
FIG. 1b shows a device for data conversion in accordance with various exemplary embodiments.

FIG. 1*a* and FIG. 1*b* show systems 100 for converting data. The system 100 comprises various functional units 101-114. In the exemplary embodiment in FIG. 1*a*, the system comprises a data converter 101, a test signal circuit 102 and a monitoring circuit 103.

In some exemplary embodiments, the data converter 101 can be a pipeline analog-to-digital converter, an integrating analog-to-digital converter, a delta-sigma analog-to-digital converter, a flash analog-to-digital converter, a successive approximation (SAR) analog-to-digital converter, a direct digital-to-analog converter, a parallel digital-to-analog converter, a delta-sigma digital-to-analog converter. However, other types of converters are also possible, for example digital-to-analog converters or optical converters, etc. Moreover, a plurality of analog-to-digital converters and/or other combinations of analog-to-digital converters and digital-to-analog converters comprising a plurality of converter stages, as known for example from SAR analog-to-digital converters, may be examples of the data converter 101.

The test signal circuit 102 can be used for determining the transfer characteristic of the data converter, for example in order to determine time-associated linearity parameters of the data converter, for example INL and/or DNL. In addition, it can be used for calibrating the data converter. Calibrating and/or determining the linearity parameters of the data converter 101 can be controlled by the monitoring circuit 103. Moreover, the results of calibrations and/or determinations of the linearity parameters can be stored by the monitoring circuit 103, such that they are available for later comparisons.

In other exemplary embodiments, it may be possible for the test signal circuit 102 to be coupled to a plurality of data converters (not shown) and to determine the transfer characteristic of said data converters, for example sequentially. Alternatively or supplementarily, there may also be a plurality of test signal circuits (not shown), such as the test signal circuit 102 which test one data converter 101 or a plurality of data converters (not shown), for example at different times, for example with different test signals.

By way of example, stored values can be compared with newly ascertained values of linearity parameters which are monitored by the monitoring circuit 103 and are compared with one another for example for different times. If a severe discrepancy among the linearity parameters ascertained in a time-associated manner occurs or a threshold value of the linearity parameters is exceeded, this can indicate a problem with the data converter 101. Such an observation can be used to indicate for example a degradation state as explained above.

The system 100 can be embodied either by means of discrete units coupled to one another, or as a single device, for example in the form of an integrated circuit. Moreover, it is possible for individual functional units from among those shown to be embodied on an integrated circuit and for other modules to be embodied separately therefrom. By way of example, the data converter 101 and the test signal circuit 102 can be embodied as an integrated circuit, but the monitoring circuit 103 can be present as a dedicated assembly. Any other variants thereof are also possible.

As shown by way of example in FIG. 1b, the system 100 can comprise further components. It should be noted that these additional components can be implemented independently of one another that is to say that, in some exemplary embodiments, it is also possible for just one or some of these components to be provided.

In exemplary embodiments in accordance with FIG. 1b, a sensor A 110, a sensor B 111 and a sensor C 112 are present, for example. These sensors 110-112 can supply measurement data concerning ambient parameters to the monitoring circuit 103, which can be taken into account by the monitoring circuit when determining linearity parameters and/or evaluating the latter.

The system 100 in FIG. 1b furthermore comprises, in addition to the units in FIG. 1a, a signal interface 104, a shutdown circuit 105, a bus system 106, inputs 107, outputs 108 and in-/outputs 109. In addition, the exemplary embodiment shown in FIG. 1b has, as described above, three sensors 110-112, which can detect for example ambient parameters such as temperature, supply voltage and further parameters. In some exemplary embodiments, it may supplementarily or alternatively be possible to receive sensor data via the in-/outputs 109 or to provide them to other circuits.

Furthermore, the system 100 can comprise a first memory 113 and a second memory 114. The memories 113, 114 can also be embodied jointly. In some exemplary embodiments, there may also be just one of the memories 113, 114.

The first memory 113 can be for example a reference memory RefRAM 113. The second memory 114 can be for example a correction memory CRAM 114. The memories can be embodied as random access memory, as nonvolatile memory within a chip, e.g. as flash memory or as one-time programmable RAM (referred to as: one-time programmable memory, OTP). They can also be embodied as nonvolatile memory within a module, for example as a second chip, for example in combination with a microcontroller. By way of example, CRAM 113 and/or RefRAM 114 can also be part of the monitoring circuit 103 and/or of the test signal circuit 102 and/or of the data converter 101, but other integrations are also possible. CRAM 114 and/or RefRAM 113 can be embodied as volatile memory. RefRAM 113 and CRAM 114 can each be embodied differently and/or as a combination of different memory types. By way of example, the RefRAM 113 can be embodied as a one-time programmable nonvolatile memory (OTP NVM), and CRAM 114 can be embodied as volatile memory.

The signal interface 104 can be configured to provide a signal based on the state of the data converter. The signal interface 104 makes it possible that the state of the data converter 101 as determined by the monitoring circuit 103 can be communicated to other systems, for example via the output 108 or the in-/output 109. This can have the advantage that a warning signal can be provided to a user of the apparatus in which the system 100 is installed, depending on the ascertained state of the data converter. By way of example, a maintenance lamp in a motor vehicle can be activated.

The shutdown circuit 105 can be configured to shut down the data converter 101 on the basis of the state of the data converter.

The shutdown circuit 105 can cause the data converter 101 to be deactivated, in particular, if the monitoring circuit 103 arrives at the conclusion that the data converter 101 is operating erroneously. This can be advantageous, in particular in the case of systems embodied with multiple redundancy or redundancy, if the erroneously operating data converter supplies incorrect values. In this case, a further data converter (not illustrated) can continue to operate correctly and undertake the tasks of the defective data converter.

By means of the functional units shown, various exemplary embodiments of the system 100 may be able to carry out individual, some or all of the methods described below. The methods described below can be carried out wholly or in part by the monitoring circuit 103. However, the methods can also be carried out independently of the system 100.

Figure 2:
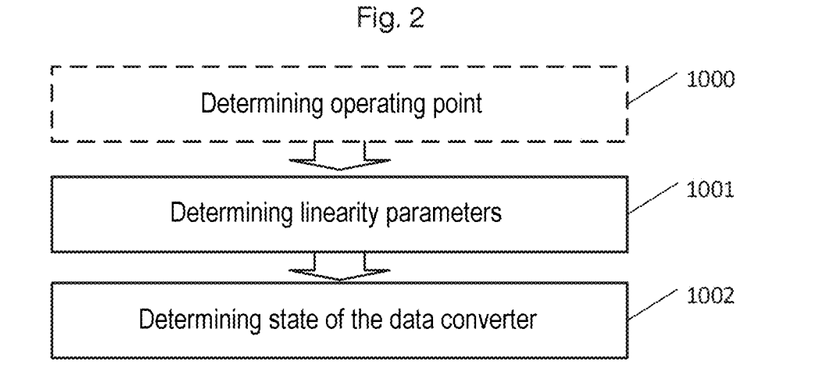
FIG. 2 shows a flow diagram for a method for monitoring a data converter in accordance with various exemplary embodiments.

FIG. 2 shows a flow diagram for a method for monitoring a data converter in accordance with various exemplary embodiments.

The data converter can be for example the data converter 101 from FIG. 1a and FIG. 1b. By way of example, the data converter can be an analog-to-digital data converter. The data converter can be configured to convert analog signals, e.g. on the basis of a calibration, into digital values. The method can be correspondingly applied to other data converters, wherein, in the case of a digital-to-analog converter, for example, a digital signal can be provided and the latter can be converted into an analog signal. The same applies to other types of data converters, for example optical converters.

Step 1001 involves determining a multiplicity of time-associated linearity parameters, describing a linearity of the data converter, at a multiplicity of different times. Determining the multiplicity of time-associated linearity parameters can comprise each converting a predefined test signal by means of the data converter and detecting the converted signal. As described above, such a linearity parameter can be INL or DNL, for example.

In the case of an analog-to-digital data converter, by way of example, an analog test signal having a predefined characteristic can be provided. Examples of test signals are explained further below in association with FIGS. 3a-3c. The test signal can be provided by the test signal circuit 102, for example.

In some exemplary embodiments, at step 1000 before step 1001, an operating point of the data converter can first be determined. Furthermore, determining a correctness of the operating point state of the data converter on the basis of a comparison of the operating point with at least one third value can be carried out. By way of example, the third value can represent a minimum voltage for the operation of the data converter.

If correctness is present, the method can be carried out in accordance with step 1001 and determining the multiplicity of time-associated linearity parameters and determining the state of the data converter can be carried out as described below and above. In some exemplary embodiments, the method can be terminated if correctness is not present, for example because an error state of the data converter is already present.

This can have the advantage that in the case of operation remote from a correct operating point, a poor state of the data converter is not incorrectly deduced. By way of example, an analog-to-digital data converter can have a greatly nonlinear behavior if the supply voltage is too low. In such a case, it is possible to prevent the presence of a defect of the data converter from being incorrectly deduced on account of the poor linearity properties determined under these conditions and/or the time for carrying out the determination of the linearity parameters can be saved.

Step 1002 involves determining a state of the data converter on the basis of comparing at least one linearity parameter of the multiplicity of time-associated linearity parameters with a comparison parameter.

The comparison parameter can be ascertained in various ways, as described below and above.

By way of example, a threshold value for the at least one linearity parameter can be involved. The threshold value can be defined for example for the linearity parameter INL and can have the value 2.0, for example, as value. The threshold value can correspond to a value guaranteed by the manufacturer of the data converter during operation under specified conditions, e.g. in a specified temperature range, or can be a value deviating therefrom. The comparison of the ascertained value for INL with the threshold value makes it possible to ascertain the linearity behavior for the time at which the method was carried out. If INL=2.4 is ascertained, for example, it is possible to deduce therefrom that the data converter does not meet the linearity requirements for the application.

Such monitoring can be effected for a single linearity parameter, as mentioned above, for example, but it can also be effected simultaneously for a plurality of linearity parameters. Determining the linearity behavior can be based for example on the maximum observed deviation of all observed linearity parameters, or more complex decisions can be taken. By way of example, different threshold values can be defined for different linearity parameters. This can be advantageous, in particular, if a data converter comprises different subconverters or converter stages. In such cases, the individual subconverters can be considered individually and a different state of the data converter can be ascertained in different cases. By way of example, for a pipeline ADC constructed with redundancy, an assessment made if a converter stage responsible for a more significant bit has poor linearity parameters may be different than the assessment made if this is the case for a converter stage responsible for a less significant bit.

In other exemplary embodiments, the comparison parameter can comprise at least one further time-associated linearity parameter of the multiplicity of time-associated linearity parameters, or threshold values can be derived from a linearity parameter that was determined at a previous time. It may thus be possible to carry out relative comparisons. In this regard, for example at a first time, for example in the factory, it is possible to ascertain an ascertained linearity parameter as reference value, for example INL in accordance with the method 1001-1002 described above. The reference value thus ascertained can be stored with a tolerance as threshold value and then be used as comparison parameter in subsequent passes of the method. By way of example, INL=1.2 may be ascertained at the first time. By way of example, a tolerance of +0.7 may be assumed. The threshold value is then fixed at 1.9 in this example. If INL≤1.9 is ascertained at a later time, the time-associated linearity behavior is deemed to be acceptable. By contrast, if INL>1.9 is ascertained, an excessively great deviation of the linearity behavior from the desired or specified linearity behavior is established.

This method, like correspondingly configured devices corresponding to the system 100 as well, can have the advantage that a change in a state of the data converter over time can be identified on the basis of comparing the linearity parameters. The method allows observation of the state of the data converter under conditions of use in the course of operation, for example when the data converter is installed in a device, for example a vehicle. This can have the advantage that aging-dependent effects, which are not always observable during production tests or during service intervals, become observable. As a result, it may be possible to observe a long-term trend in the state of the data converter in order to observe aging processes. It may likewise be possible to detect sudden failure of the data converter, for example such effects which occur on account of an open circuit, for example on account of electromigration or radiation damage, for example on account of cosmic radiation. In such cases, it may be particularly simple to identify a change in the linearity parameters.

In some exemplary embodiments, step 1001 and/or step 1002 can additionally involve determining at least one time-associated ambient parameter, for example the temperature or the supply voltage. This can be carried out by means of one of the sensors 110-112, for example, or information regarding the ambient parameters can be provided to the controller of the system 100 via an interface 108, 109. The ambient parameter can be taken into account when determining the linearity parameter in step 1001 and/or when determining the state in step 1002. By way of example, the dependence of a linearity parameter on temperature may be known and a linearity parameter ascertained at a specific temperature, e.g. 40° C., can be computed on the basis of a linearity parameter ascertained at a reference temperature, e.g. 20° C. Moreover, it may be possible to parameterize threshold values as a function of the ambient parameters. In this regard, by way of example, the parameter INL indicated above could have a threshold value of 1.5 for low temperatures, e.g. temperatures of up to 30° C., and a higher threshold value of 1.9 for higher temperatures, e.g. of between 100° C. and 150° C. The same is correspondingly applicable to the comparison of linearity parameters determined at different times. Said linearity parameters can likewise be normalized to standard conditions or the threshold values for an allowed deviation can be altered, for example in a manner corresponding to the ambient temperature. The dependence on other ambient parameters can also be taken into account here, for example the supply voltage available or a combination of different ambient parameters. In other exemplary embodiments, a threshold value can be chosen such that an entire specified temperature range for which the data converter is intended can be covered, e.g. a threshold value of 2 for INL in a temperature range of:

−40° C. to 150° C.

Figure 3A:
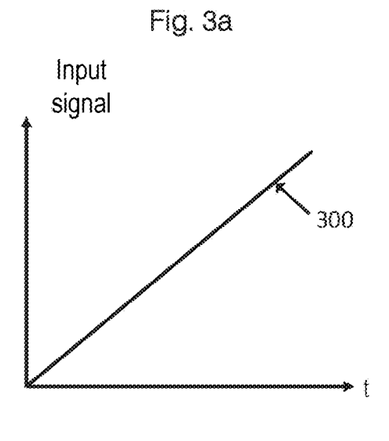
FIG. 3a, FIG. 3b and FIG. 3c show examples of predefined test signals in accordance with various exemplary embodiments.
Figure 3B:
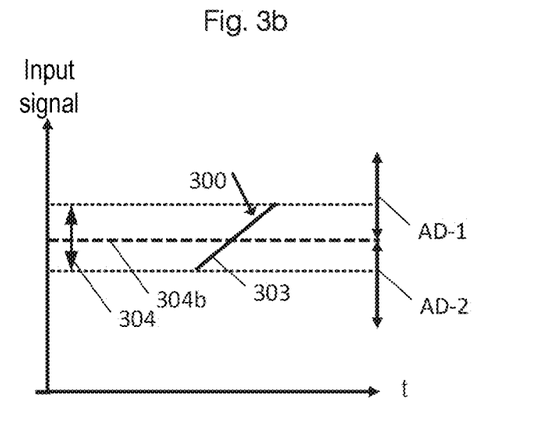
Figure 3C:
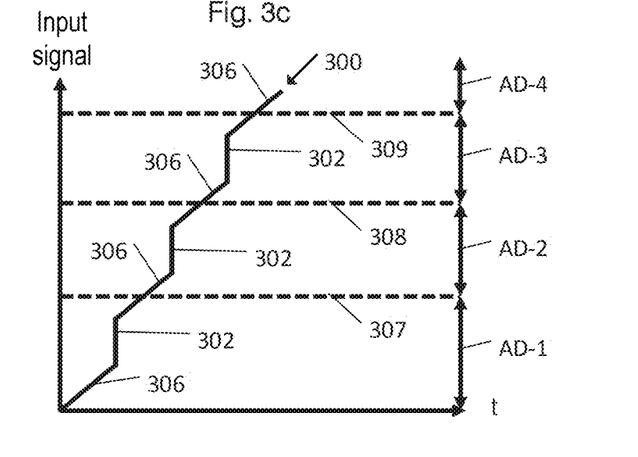

FIG. 3a, FIG. 3b and FIG. 3c show examples of predefined test signals in accordance with various exemplary embodiments.

The ascertainment of the transfer characteristic of a data converter is possible for a multiplicity of test signals. In some examples, test signals which are at least in sections monotonic, in particular linear, are used. This can have the advantage that it can be very simple to ascertain a nonlinear behavior of the transfer characteristic of the data converter if the output signal of the data converter does not have the linearity property of the test signal any longer. In other words, in this case, non-linearities at the output signal directly reflect the non-linearity of the data converter.

FIG. 3a shows a test signal 300 which is monotonic and linear. A predefined characteristic of the test signal 300 is thus a ramp characteristic. A ramp characteristic is understood to mean a monotonic signal profile. In particular, a linear ramp characteristic is involved in the example illustrated, wherein the ramp characteristic can be substantially described at least in sections by a linear profile. The signal can be repeated after specific times, either by a reversal of the slope gradient or by a jump back to the initial value, e.g. in order to carry out a renewed determination of the linearity parameters.

FIG. 3b likewise shows a test signal 300, but this test signal exhibits a more complex profile. In this case, the test signal comprises only a part of an input range of the data converter. Said part can comprise, in particular, a range of a design-specific maximum non-linearity.

Data converters, depending on their design, have partial ranges of an entire input range at which the non-linearity is typically particularly high.

By way of example, the input range, also referred to as dynamic range of a data converter can extend from 0 V to 2.55 V. By way of example, DNL can be below 1.4 in the range of 0 V to 1.25 V and can likewise be below 1.4 in the range of 1.30 to 2.55 V, but can assume values of up to 1.8 in the range of between 1.25 V and 1.30 V. In this case, the linearity range would be maximal in the range of 1.25 V to 1.30 V. Aging phenomena are typically manifested the fastest in this range. By restricting the test signal to this part of the input range, it is possible, in some exemplary embodiments, to shorten a time for determining the linearity parameters, without significantly losing accuracy in the determination of the state of the data converter.

Such a situation is shown in the example in FIG. 3b. In this case, the converter is an analog-to-digital converter. In the example in FIG. 3b, use is made of the fact that, on the basis of the design of simulations and/or experiments, it is known that there is a characteristic range 304 around a characteristic value 304b for the linearity parameter in which the data converter has a range of maximum non-linearity. By way of example, a successive approximation analog-to-digital converter can be involved here, wherein the range of design-specifically maximum non-linearity comprises a value range involving the switching of a most significant bit, MSB, and a second most significant bit, MSB-1, indicated by the two value ranges AD-1 and AD-2.

The position of the characteristic range 304 is only one example. The method can also be applied in other situations in which for example maximum values for linearity parameters occur at positions of the test signal for a specific data converter design.

In order to make use of the fact that a range of design-specifically maximum non-linearity is known, the test signal is adapted to the input value range that leads to the design-specifically maximum linearity of the output value range. This is shown by way of example by the linear test signal 303 in FIG. 3c, which covers the characteristic range 304, but does not assume values outside the characteristic range 304. In this regard—with the same signal waveform, for example ramp steepness of the signal—less time is required for the test signal pass and a determination of the linearity parameter is carried out at the same time at the crucial points, at 304b and in the range 304 in the example shown.

What can be achieved in various ways is that the test signal comprises only a part of an input range of the data converter. By way of example, the test signal can be fashioned such that it assumes only values around this range with a predefined interval. In other examples, the rate of rise can be increased in the ranges outside the relevant part of the input range in order to be able to conclude the method in a shorter time. Moreover, different units can provide a test signal, wherein individual units provide only test signals in a respective part.

The data converter can also be a pipeline analog-to-digital converter having a multiplicity of converter stages.

FIG. 3e shows a further example of such a test signal, provided as input signal to a data converter, on the basis of the example of an analog signal for an analog-to-digital converter having a multiplicity of converter stages having respective value ranges AD-1 to AD-4. A pipeline analog-to-digital converter is involved in the example shown, wherein each of the converter stages has conversion ranges that are in each case at least partly different from one another, and wherein the test signal comprises the part of the input range of the data converter which comprises at least two of the at least partly different conversion ranges.

The value ranges of the converter stages AD-1 to AD-4 have transition ranges, wherein the characteristic values 307, 308, 309, which can be for example the center point of the interval of the transition ranges, are shown in each case. The test signal 300 shown has parts having linear rises 306 and abrupt rises 302.

By means of such test signal waveforms, the measurement can be concentrated on those ranges of the input range at which high non-linearities should be expected on account of the design. As a result, it is likewise possible to achieve a shorter time per measurement and thus a higher accuracy given constant time available for the measurements.

In the example shown in FIG. 3c, the transition ranges result from the fact that the data converter comprises a plurality of converter stages. Transition ranges can generally always occur if a converter, for example an analog-to-digital converter, comprises at least two converter states, as is known for example from SAR analog-to-digital converters and flash analog-to-digital converters. In such cases, the test signal can likewise comprise the part of the input range of the data converter which comprises a transition range between the at least two analog-to-digital converter states.

In this case, the transition ranges, as shown in the example in FIG. 3c, can adjoin one another. In other exemplary embodiments, the transition ranges can also overlap. This can have the advantage that the entire range or at least partial ranges of the converter stages can definitely be characterized.

Figure 4:
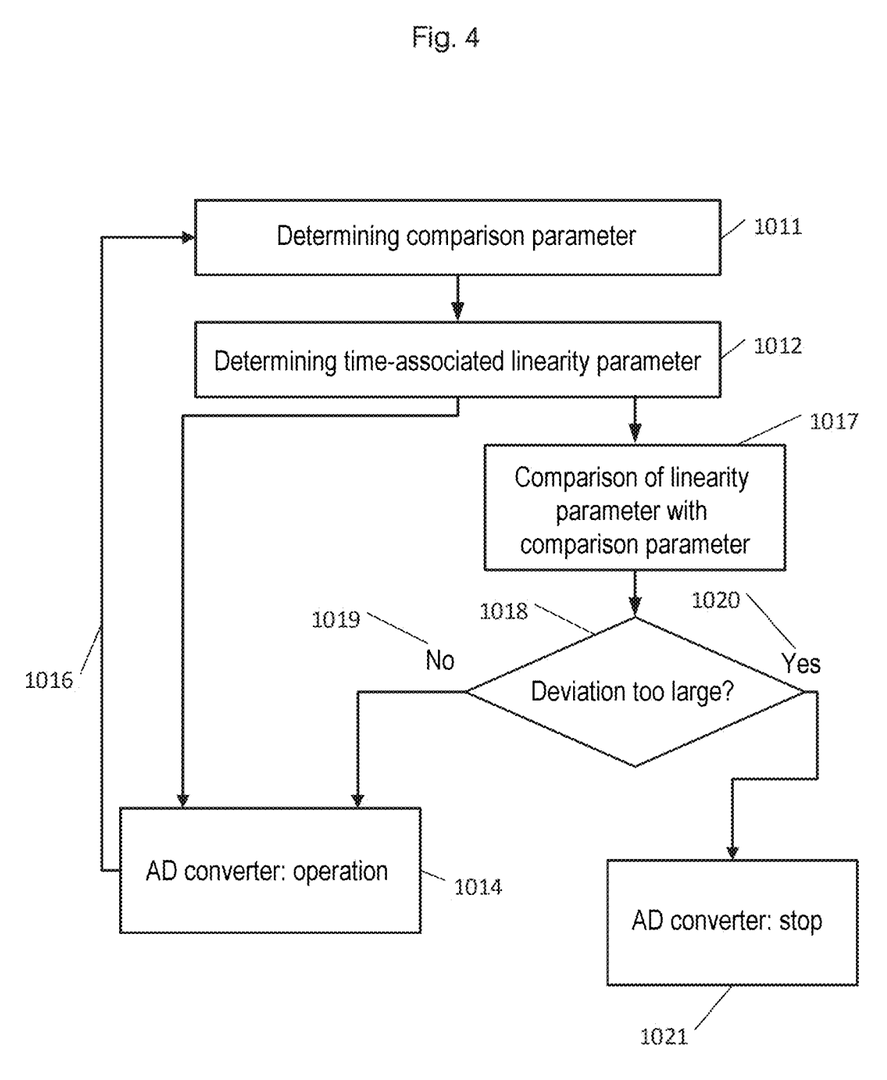
FIG. 4 shows a further flow diagram for a method for monitoring a data converter in accordance with various exemplary embodiments.

FIG. 4 shows a further flow diagram for a method for monitoring a data converter in accordance with various exemplary embodiments.

In the exemplary embodiment shown in FIG. 4, the data converter is an analog-to-digital converter comprising a correction memory CRAM and a reference memory RefRAM. These memories can be implemented in any desired manner, in particular as nonvolatile memories. RefRAM 113 and CRAM 114 may be as described in association with FIG. 1b. These memories can be used for storing calibration data sets. The correction memory serves for storing a present calibration data set currently being used for the calibration of the data converter, while the reference memory serves for storing a reference calibration data set, as explained below. Supplementarily or alternatively, threshold values, as described above and below, can also be stored in the reference memory and/or in the correction memory.

Step 1011 involves determining a comparison parameter. Said comparison parameter can comprise for example different limit values, for example INL<2.0 and for DNL limit values specific to different ranges of the input range of the converter, for example <0.2 for the range of 0% to 20% of the input range, <0.7 for the range of between 20% and 70% and 0.3 for the input range up to 100%.

As described above in association with FIG. 2, the comparison parameter is used to determine the linearity behavior of the data converter at any time. In the case of the analog-to-digital converter, the linearity parameters can be determined for example by means of comparison of the test signal characteristic with the digital signal converted by the analog-to-digital converter.

The comparison parameter can be fixedly predefined, for example defined in the design phase for the analog-to-digital converter, or can be ascertained by a method in accordance with FIG. 2 as a reference value or alternatively during the use of the analog-to-digital converter.

In some exemplary embodiments, determining the comparison parameter can be carried out at the factory. The determining can furthermore be carried out for one of the following reasons or else for a plurality of the following reasons:
  a production test of the analog-to-digital converter,
  a module test of the analog-to-digital converter, wherein the analog-to-digital converter is coupled to at least one external component,
  exceedance of a predefined value of a supply voltage at the analog-to-digital converter, or
  conclusion of an initialization phase of the analog-to-digital converter.

The comparison parameter can be stored in a memory, which can be embodied in various ways, for example as a flash memory.

Step 1012 involves determining at least one time-associated linearity parameter as described above. Proceeding from step 1012, the method can be continued at step 1013 and/or at step 1017. In this case, step 1013 step and 1017 can be carried out simultaneously or successively.

Step 1017 involves comparing at least one linearity parameter determined in step 1012 with the at least one comparison parameter. This comparison can take place for example by forming a difference. A difference can be calculated in various ways. If the linearity parameters each comprise only a single value, the difference can be determined as the difference between the respective values of the linearity parameters. If the linearity parameters each comprise more than one linearity parameter, the difference can be calculated for example from values of mutually corresponding respective linearity parameters. The comparison parameter can be, as described, a fixed threshold value or else another of the multiplicity of linearity parameters.

Mutually corresponding linearity parameters are understood to mean linearity parameters that have identical or similar information with regard to the transfer function of the data converter.

Supplementarily or alternatively, it is also possible to employ other methods, for example quotient formation and comparison with a limit value for the quotients or direct greater than/less than comparisons of the linearity parameters with the comparison parameter.

Step 1018 involves determining the state of the analog-to-digital converter, on the basis of the comparing in step 1017. In the exemplary embodiment shown in FIG. 4, the state is represented as logical information. In the exemplary embodiment shown, the state is determined by checking whether the difference determined at step 1017 is greater than a difference threshold value. In exemplary embodiments in which other forms of calculation are chosen for determining the state, corresponding threshold values can be chosen, for example a quotient threshold value, in order to determine the state. As described above, in other exemplary embodiments, other forms of state description can be employed. In exemplary embodiments in which the linearity parameters comprise a multiplicity of values, the state can also be determined on the basis of joint consideration of the component-by-component comparison of individual associated values. The joint consideration can consist for example in addition of the determined differences or in addition of the squares of the absolute values of the determined differences or in a consideration of that associated value pair with the maximum difference. Other methods such as are known from the field of curve fits, for example, can also be employed. By way of example, it may be known that individual values of the linearity parameters have a specific dependence in relation to one another, for example a quadratic profile of the values as a function of an index of the values. In such cases, curve fits can be carried out and ascertained residues of the curve fits of linearity parameters can be compared with one another.

In some exemplary embodiments, the state can be ascertained and/or indicated on the basis of the absolute value of the difference determined at step 1017, for example as a variable normalized to between 0 and 100%, wherein the variable is determined at 100% if the difference has the value 0, and is determined at 0% if the difference reaches or exceeds the difference threshold value. In this case, it is likewise possible for the state to be ascertained from a multiplicity of such values which can be determined from the respective values of linearity parameters or from apportionment of respective values of linearity parameters. On the basis of the state, it is possible to provide a signal that is a measure of the state of the analog-to-digital converter. Such a signal can be used to communicate the state of the data converter to other units.

Depending on the state of the analog-to-digital converter that is determined at 1018 and/or the corresponding signal, the method can be continued differently.

If a state is determined which indicates that the analog-to-digital converter is usable, the method can be continued at step 1014, as indicated by the arrow 1019. By contrast, if a state is determined which indicates that the analog-to-digital converter is not usable or is potentially at risk of failure, the method can be continued at step 1021, as indicated by the arrow 1020. For this purpose, the signal that is a measure of the state of the analog-to-digital converter can be used by the monitoring circuit 103 in order to perform control as to whether the method is continued at step 1014 or at step 1021.

Step 1014 involves operating the analog-to-digital converter.

As shown by the arrow 1016, the method can be continued at step 1011, wherein at a later time, for example on account of changed ambient parameters, comparison parameters are once again determined or the comparison parameters already determined are correspondingly modified, for example on the basis of the temperature of the data converter. In some exemplary embodiments (not shown) the method can also be continued at step 1012, that is to say that it is possible for determining the comparison parameters anew not to be carried out, particularly if a fixed threshold value is used. This can have the advantage that fixed values can be used for the comparison parameters, which can reduce the complexity of the control for the method and/or the storage requirements.

Step 1021 involves outputting a warning message and/or some other suitable measure, such as shutting down the analog-to-digital converter. In this case, the shutdown can be effected by means of the shutdown circuit 105. The warning message can be output to the in-/output 109 or the in-/outputs 109 by the monitoring circuit 103 via the bus 106. The shutting down can be effected on the basis of the measure of the linearity behavior of the analog-to-digital converter, as explained for 1018.

Figure 8:
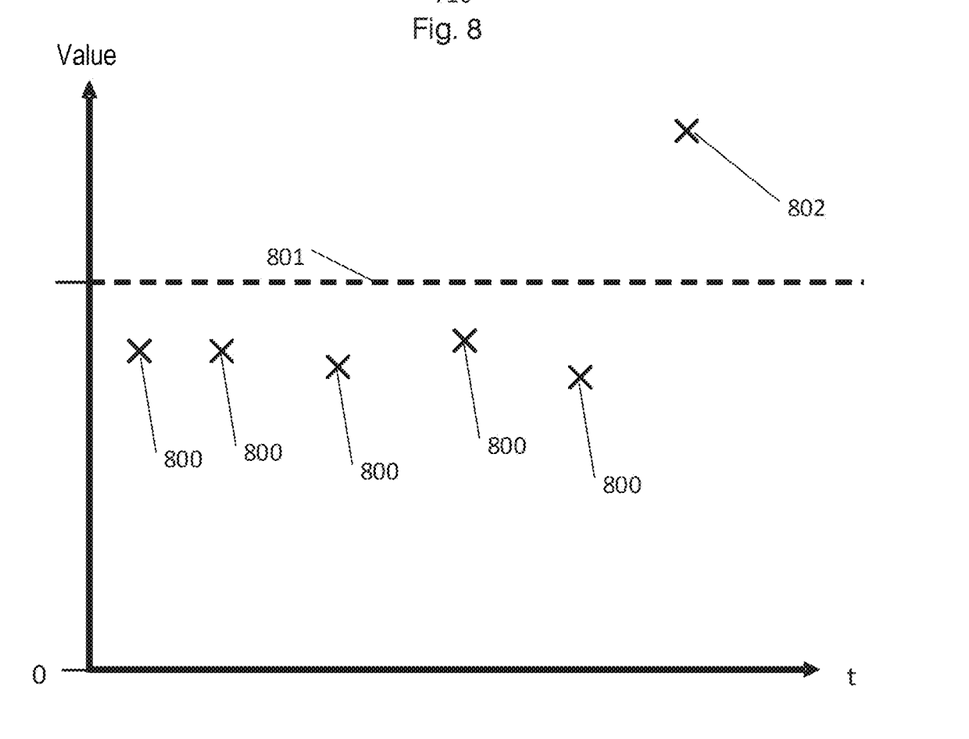
FIG. 8 shows one example of a temporal profile of a linearity parameter in accordance with various exemplary embodiments.

FIG. 8 shows one example of a temporal profile of a linearity parameter in accordance with various exemplary embodiments. Said profile can be ascertained for different times by means of the methods described above. By way of example, the linearity parameter can be INL. The values 800, 802 ascertained for the respective times allow a conclusion to be drawn about the state of the analog-to-digital converter at the respective time. A threshold value 801 is likewise depicted schematically in FIG. 8. The values 800 lie below the threshold value 801, that is to say indicate that the linearity behavior of the analog-to-digital converter at the respective times satisfies the requirements. The value of the linearity parameter 802 at a later time lies above the threshold value 801, however. It can be concluded from this that the linearity behavior at this time no longer meets the requirements, that is to say that an error state is present. An abrupt change in the linearity parameters as shown in the example in FIG. 8 can indicate a technical defect of the analog-to-digital converter. It is then possible to react to this, as described above.

Figure 5:
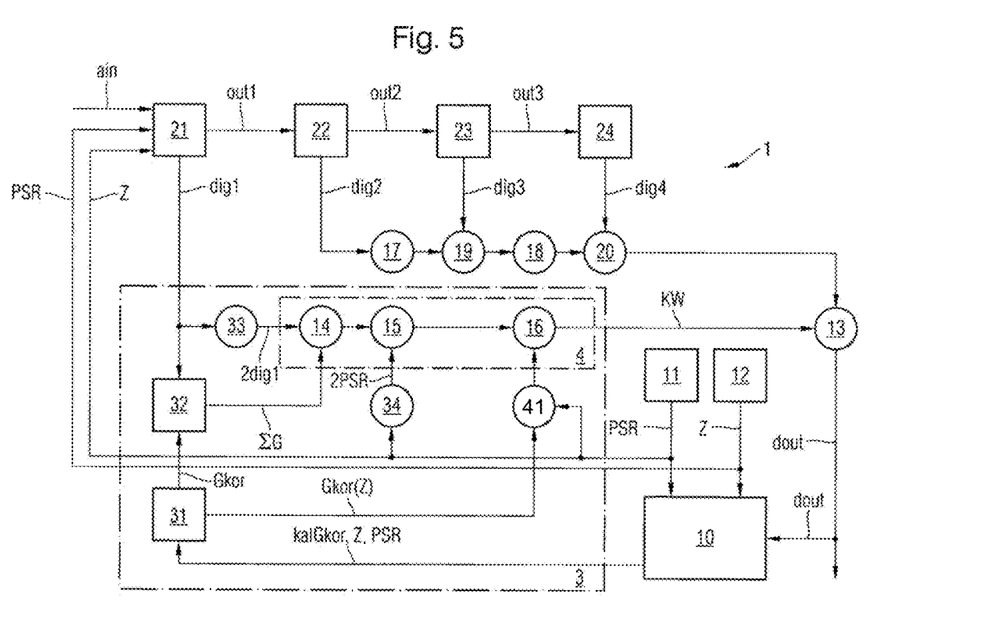
FIG. 5 shows a pipeline analog-to-digital converter in accordance with various exemplary embodiments.

FIG. 5 shows a pipeline analog-to-digital converter in accordance with various exemplary embodiments.

The analog-to-digital converter 1 shown in FIG. 5 may constitute one example of the analog-to-digital converter 101 described.

By way of example, the analog-to-digital converter 1 comprises four converter stages 21-24. The first converter stage 21 provides a digital converter output value dig1 and an amplified, sampled analog output signal out1, weighted with a weighting value tatG, for a received analog input signal ain. A correction device 3 is provided for each converter stage 21-24.

The test signal can be provided at the input ain in.

Only the correction device 3 for the first converter stage 21 is illustrated in FIG. 5. The correction devices for the other converter stages 22-24 are not depicted for reasons of clarity.

The correction device 3 comprises a first memory 31, a second memory 32, a first shift device 33 and a combination device 4. The first memory 31 provides at least one weighting correction value Gkor, corresponding to a difference between the actual weighting value tatG and an ideal weighting value idG of the converter stage 21, for each capacitor unit K1-K16 of the converter stage 21, the added output values of which form the digital converter output value dig1.

$$Gkor = tatG - idG \quad (1)$$

Such weighting values can be one example of values of calibration data sets.

The second memory 32 provides a summation weighting correction value IG, corresponding to a sum of the weighting correction values Gkor of the capacitor units K1-K16 driven by means of the respective converter output value dig1, for each digital converter output value dig1.

The first shift device 33 doubles the digital converter output value dig1 to form an ideally weighted digital converter output value 2dig1. An ideal bit weighting by the factor 2 corresponds in binary to a shift of the digital converter output value dig1 by one bit position to the left.

The combination device 4 combines the summation weighting correction value IG and the doubled digital converter output value 2dig1 to form a corrected output value KW.

The corrected output value KW is used to correct the digital output value dout by the gain error and by the switchover error.

In other words, a (partial) conversion of the received analog input signal is effected by the analog-to-digital converter using a calibration determined by a calibration data set. In accordance with the architecture of pipeline ADCs, the complete conversion is effected by repeating the method described here in association with the converter stage 21 for the remaining converter stages 22-24 in order to obtain the output signal dout after a summation at 13.

If an analog test signal having a predefined characteristic is provided at ain, a transfer characteristic of the analog-to-digital converter can be determined by the comparison of the predefined characteristic with the output signal dout. The linearity parameters can also be determined therefrom.

By way of example, the analog-to-digital converter 1 comprises a first summation device 13, which adds the digital converter output values dig1-dig4 of the converter stages 21-24 to form the digital output value dout.

By way of example, the analog-to-digital converter 1 also comprises a random number generator 11, which generates a digital random value PSR.

Furthermore, a control device 100 can be provided, which calibrates a respective weighting correction value Gkor of a unit capacitor C0-C64 by means of the random value PSR fed into the signal path of the analog-to-digital converter 1 and updates the respective associated weighting correction value Gkor of the unit capacitor C0-C64, which is stored in the first memory 31, by means of the calibrated weighting correction value kalGkor.

The control device 10 is thus able to calibrate the analog-to-digital converter. In the exemplary embodiment illustrated, it is furthermore configured so as to carry out a method for monitoring the linearity behavior as described above.

In addition, the analog-to-digital converter 1 can comprise a counting device 12, which provides a respective pointer Z that is uniquely assigned to the unit capacitor C0-C64 to be calibrated by the control device 10. The counting device 12 feeds the pointer Z together with the random signal PSR into the signal path of the analog-to-digital converter 1 or into the first converter stage 21. Furthermore, the counting device 12 provides the pointer Z at the input of the control device 10.

Preferably, the control device 10 updates the weighting correction value Gkor of the unit capacitor C0-C64 currently to be calibrated, which is stored in the first memory 31, by means of the pointer Z received at the input and the calibrated weighting correction value kalGkor.

By way of example, the control device 10 generates the calibrated weighting correction value kalGkor of the unit capacitor C0-C64, which is defined by the present pointer Z in each case, by means of the random value PSR and the digital output value dout.

The first memory 31 likewise receives the present pointer Z from the control device 10 and provides the weighting correction value Gkor(Z) for the respective unit capacitor C0-C64 to which the received present pointer Z points.

Moreover, a second shift device 34 can be provided, which doubles the present random value PSR in order to form a doubled random value 2PSR, wherein the doubling corresponds to a multiplication by the ideal weighting value idG. The ideal weighting value idG is preferably 2 and the second shift device 34 doubles the present random value PSR by means of shifting by one bit position to the left.

The combination device 4 can comprise a second summation device 14, which adds the summation weighting correction value IG and the doubled converter output value 2dig1.

Furthermore, the combination device 4 can comprise a first subtraction device 15, which subtracts the doubled random value 2PSR from the sum of the summation weighting correction value IG and the doubled converter output value 2dig1.

The analog-to-digital converter 1 can furthermore comprise a multiplication device 41, which multiplies the weighting correction value Gkor(Z) provided by the first memory 31 by the random value PSR of the random number generator 11.

The combination device 4 can also comprise a second subtraction device 16, which subtracts the weighting correction value Gkor(Z) multiplied by the random value PSR from the multiplication device 41 from the difference between the sum of the summation weighting correction value IG and the doubled converter output value 2dig1 and the doubled random value 2PSR.

The third shift device 17 and the fourth shift device 18 double the binary value of the digital converter output value dig2 of the second converter stage 22 and, respectively, the digital value of the digital converter output value dig3 of the third converter stage 23. The third and fourth summation devices 19 and 20 add the doubled converter output values dig2 and dig3 and the converter output value dig4 to form the digital converter output value dout of the analog-to-digital converter 1.

At least two converter stages 21, 22 can be provided and the analog-to-digital converter 1 can be of fully differential design.

Figure 6:
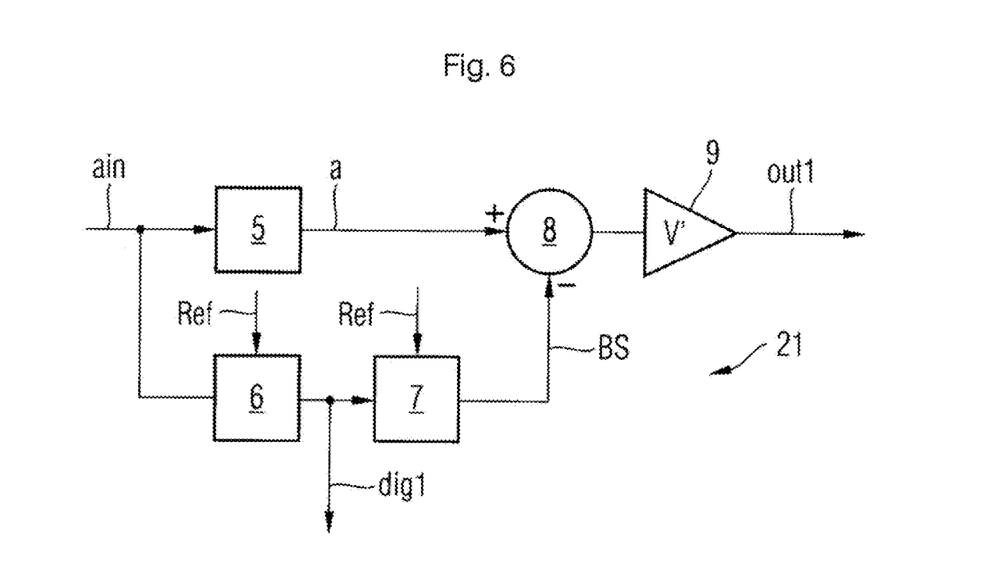
FIG. 6 shows a schematic block diagram of a converter stage in accordance with FIG. 5.

FIG. 6 shows a schematic block diagram of a converter stage in accordance with FIG. 5.

FIG. 6 shows one example of a first converter stage 21 from FIG. 5. The further converter stages 22-24 can be embodied correspondingly. The first converter stage 21 comprises a Sample & Hold circuit 5, a comparator unit 6, a digital-to-analog converter 7, a subtraction device 8 and an amplification device 9.

The Sample & Hold circuit 5 samples the analog input signal ain and thus provides a sampled analog input signal a.

The comparator unit 6 compares the analog input signal ain with a reference value Ref in order to generate the digital converter output value dig1. The digital-to-analog converter 7 converts the digital converter output value dig1 into an analog DR converter output signal BS by means of the capacitor units K1-K16.

$$BS = \mathrm{dig1}/b * \mathrm{Ref} \quad (2)$$

The parameter b denotes the number of comparators of the comparator unit, and b is 16, for example.

Preferably, the digital-to-analog converter 7 comprises a calibration capacitor C0 for calculating the weighting correction values Gkor of the unit capacitors C1-C64 of the capacitor units K1-K64 (not shown), said calibration capacitor being embodied as a unit capacitor.

The subtraction device 8 subtracts the analog DA converter output signal BS output by the digital-to-analog converter 7 from the sampled input signal a. The amplification device 9 amplifies the output signal output by the subtraction device 8 with a predetermined gain factor V, which corresponds to the real gain factor of the amplification device 9, in order to form the analog output signal out1.

$$\mathrm{out1} = V^* (a - \mathrm{dig1}/b * \mathrm{Ref}) \quad (3)$$

Preferably, the comparator unit 6 codes the digital converter output value dig1 in accordance with a thermometer code, and the capacitor units K1-K6 each have a predetermined number of unit capacitors C1-C64. This considerably simplifies the production of the capacitor units and of the calibration capacitor.

The actual weighting value tatG is formed by the analog DA converter output signal BS amplified with the actual gain factor V of the amplification device 9 (see equation 5).

$$\mathrm{out1} = V'^* a - V'^* \mathrm{dig1}/b * \mathrm{Ref} \quad (4)$$

$$\mathrm{tatG} = V^* \mathrm{dig1}/b * \mathrm{Ref} \quad (5)$$

As explained above (cf. equation (1)), the weighting correction value Gkor corresponds to the difference between the actual weighting value tatG and the ideal weighting value idG.

Consequently, the converter stage shown in FIG. 6 converts an analog input signal into a digital signal on the basis of a calibration determined by a calibration data set. The analog-to-digital converter shown in association with FIG. 5 and FIG. 6 can be monitored by means of the methods described above or can be an element of the devices and/or systems described above.

Figure 7:
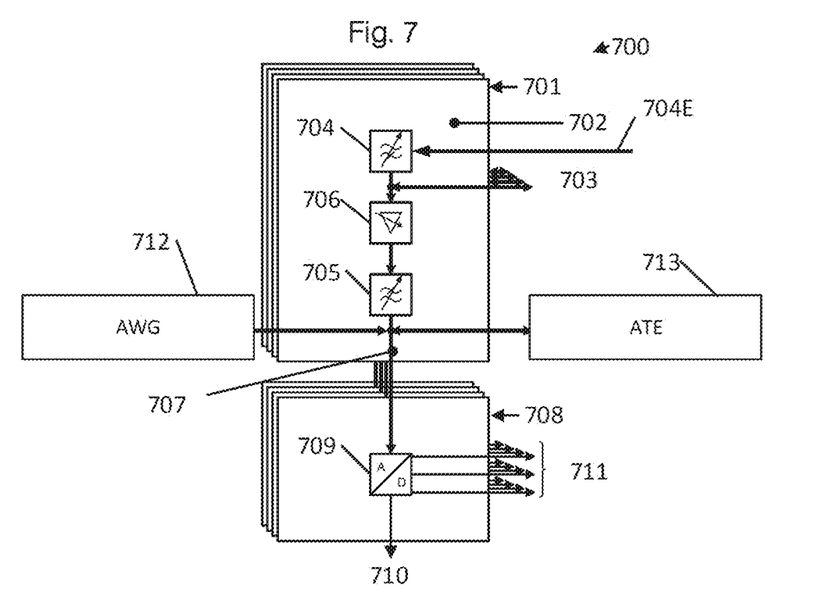
FIG. 7 shows an application example comprising a system in accordance with various exemplary embodiments.

FIG. 7 shows one application example comprising a system in accordance with various exemplary embodiments.

The application example 700 illustrated in FIG. 7 is an application example of a subcomponent of radio-frequency (RF) applications. A receiver stage 701 can comprise different assemblies for different frequency ranges. One layer 702 is shown here by way of example. Signals can be received and transmitted by the different layers, as indicated at 703. In the example shown, the signals are converted by means of different filters, a high-pass filter 704 and a low-pass filter 705, and also by means of an amplifier stage 706. Alternatively or additionally, signals can also be provided at the signal input 704E at the high-pass filter 704. The signals conditioned by the filters can be forwarded to different layers 708 at 707. The layer shown by way of example comprises an analog-to-digital converter 709. The latter is configured to provide a digital output signal 710, and also additional signals 711, which can indicate for example error messages, for example overflow, underflow and/or clipping errors.

The analog-to-digital converter 709 can correspond to the data converter 101. The application example in FIG. 7 shows two test signal circuits, which can be used in a manner corresponding to the test signal circuit 102 as described above. Firstly, an arbitrary waveform generator (AWG) 712 is present. The latter can be embodied internally, that is to say can be part of the application example 700 and be embodied for example on a chip together with the analog-to-digital converter 709. Secondly, automated test equipment ATE 713 is present. The generator 712 can provide an analog test signal at 707, which can then be converted by the analog-to-digital converter 709. The test equipment 710 receives the converted test signal and can then carry out a method as described above and below and ascertain the linearity parameters of the analog-to-digital converter 709 and thus deduce the state of the analog-to-digital converter 709.

In this case, the test equipment 710 can also be used to determine the transfer characteristic and the linearity parameters before delivery, which can be stored as reference values, for example in the form of comparison parameters, or can be used to define absolute threshold values as comparison parameters, and then to determine a linearity parameter at a multiplicity of times during operation.

At least some embodiments are defined by the examples presented below:

Example 1

A method for monitoring a data converter, comprising:
determining a multiplicity of time-associated linearity parameters, describing a linearity of the data converter, at a multiplicity of different times,
determining a state of the data converter on the basis of comparing at least one linearity parameter of the multiplicity of time-associated linearity parameters with a comparison parameter.

Example 2

The method according to example 1, wherein the comparison parameter comprises a threshold value.

Example 3

The method according to either of the preceding examples, wherein the comparison parameter comprises at least one further time-associated linearity parameter of the multiplicity of time-associated linearity parameters.

Example 4

The method according to any of the preceding examples, wherein the linearity parameter comprises:
integral non-linearity, INL, and/or
differential non-linearity, DNL,
offset error,
missing bit position,
gain error.

Example 5

The method according to any of the preceding examples, wherein determining the multiplicity of time-associated linearity parameters comprises each converting a predefined test signal by means of the data converter and detecting the converted signal.

Example 6

The method according to example 5, wherein the test signal comprises only a part of an input range of the data converter, wherein the part comprises a range of a design-specific maximum non-linearity.

Example 7

The method according to example 6, wherein the data converter comprises an analog-to-digital converter having at least two analog-to-digital converter states, and the test signal comprises the part of the input range of the data converter which comprises a transition range between the at least two analog-to-digital converter states.

Example 8

The method according to example 6 or 7, wherein
the data converter is a pipeline analog-to-digital converter comprising a multiplicity of converter stages, wherein each of the converter stages has conversion ranges that are in each case at least partly different from one another, and wherein
the test signal comprises the part of the input range of the data converter which comprises at least two of the at least partly different conversion ranges.

Example 9

The method according to either of examples 6-7, wherein
the data converter is a successive approximation analog-to-digital converter, and wherein the range of design-specifically maximum non-linearity comprises a value range involving the switching of a most significant bit, MSB, and/or a second most significant bit, MSB-1.

Example 10

The method according to any of the preceding examples, wherein the at least one linearity parameter and/or the comparison parameter are/is defined as a function of at least one ambient parameter.

Example 11

The method according to any of the preceding examples, wherein the method furthermore comprises:
determining an operating point of the data converter,
determining a correctness of an operating point state of the data converter on the basis of a comparison of the operating point with at least one third value,
wherein determining the multiplicity of time-associated linearity parameters and determining the state of the data converter are only carried out if correctness is present.

Example 12

A device for data conversion, comprising:
a data converter,
a test signal circuit configured to determine a multiplicity of time-associated linearity parameters, describing a linearity of the data converter, at a multiplicity of different times, and
a monitoring circuit configured to determine a state of the data converter on the basis of comparing at least one linearity parameter of the multiplicity of time-associated linearity parameters with a comparison parameter.

Example 13

The device for data conversion according to example 12, additionally comprising:
a signal interface configured for providing at least one signal on the basis of the state of the data converter,
a shutdown circuit configured for shutting down the data converter on the basis of the state of the data converter.

Example 14

The device according to example 12 or 13, wherein the device is configured for carrying out the method according to any of examples 1 to 11.

Although specific exemplary embodiments have been illustrated and described in this description, persons who have routine knowledge in the art will recognize that a multiplicity of alternative and/or equivalent implementations can be chosen as substitution for the specific exemplary embodiments shown and described in this description, without departing from the scope of the invention shown. The intention is for this application to cover all adaptations or variations of the specific exemplary embodiments discussed here. Therefore, the intention is for this invention to be restricted only by the claims and the equivalents of the claims.

What is claimed is:

1. A method for monitoring a data converter, the method comprising:
   determining a multiplicity of time-associated linearity parameters that describe a linearity of the data converter at a multiplicity of different times, and
   determining a state of the data converter based on comparing at least one linearity parameter of the multiplicity of time-associated linearity parameters with a comparison parameter.

2. The method as claimed in claim 1, wherein the comparison parameter comprises a threshold value.

3. The method as claimed in claim 1, wherein the comparison parameter comprises at least one further time-associated linearity parameter of the multiplicity of time-associated linearity parameters.

4. The method as claimed in claim 1, wherein the at least one linearity parameter comprises at least one of:
   an integral non-linearity (INL);
   a differential non-linearity (DNL);
   an offset error;
   a missing bit position; or
   a gain error.

5. The method as claimed in claim 1, wherein determining the multiplicity of time-associated linearity parameters comprises converting a predefined test signal using the data converter and detecting the converted predefined test signal.

6. The method as claimed in claim 5, wherein the predefined test signal comprises only a portion of an input range of the data converter, wherein the portion of the input range comprises a range of a design-specific maximum non-linearity.

7. The method as claimed in claim 6, wherein the data converter comprises an analog-to-digital converter having at least two analog-to-digital converter states, and the portion of the input range comprised by the predefined test signal comprises a transition range between the at least two analog-to-digital converter states.

8. The method as claimed in claim 6, wherein:
   the data converter is a pipeline analog-to-digital converter comprising a multiplicity of converter stages, wherein each converter stage of the converter stages has a respective conversion range that is, in each case, at least partly different from one another; and
   the portion of the input range comprised by the predefined test signal includes the respective conversion ranges of at least two of the converter stages.

9. The method as claimed in claim 6, wherein
   the data converter is a successive approximation analog-to-digital converter, and wherein the range of the design-specific maximum non-linearity comprises a value range involving switching of a most significant bit, MSB, or a second most significant bit, MSB-1.

10. The method as claimed in claim 1, wherein the at least one linearity parameter or the comparison parameter is defined as a function of at least one ambient parameter.

11. The method as claimed in claim 1, further comprising:
    determining an operating point of the data converter; and
    determining a correctness of an operating point state of the data converter based on a comparison of the operating point with at least one third value, wherein determining the multiplicity of time-associated linearity parameters and determining the state of the data converter are only carried out if the correctness is present.

12. A device for data conversion, comprising:
    a data converter;
    a test signal circuit configured to determine a multiplicity of time-associated linearity parameters that describe a linearity of the data converter, at a multiplicity of different times; and
    a monitoring circuit configured to determine a state of the data converter based on comparing at least one linearity parameter of the multiplicity of time-associated linearity parameters with a comparison parameter.

13. The device for data conversion as claimed in claim 12, further comprising:
    a signal interface configured to provide at least one signal based on the state of the data converter; and
    a shutdown circuit configured to shut down the data converter based on the state of the data converter.

14. The device for data conversion as claimed in claim 12, wherein:
    the monitoring circuit is configured to determine an operating point of the data converter, and determine whether the operating point of the data converter is correct based on a comparison of the operating point with at least one third value; and
    the determining the multiplicity of time-associated linearity parameters and the determining the state of the data converter are only performed if the operating point is determined to be correct.

15. The device for data conversion as claimed in claim 12, wherein:
the test signal circuit is configured to provide a predefined test signal;
the predefined test signal comprises only a portion of an input range of the data converter, wherein the portion of the input range comprises a range of a design-specific maximum non-linearity; and
the data converter is configured to convert the predefined test signal to a converted test signal.

16. The device for data conversion as claimed in claim 15, wherein the data converter is a pipeline analog-to-digital converter comprising a multiplicity of converter stages, wherein each converter stage of the converter stages has a respective conversion range that is, in each case, at least partly different from one another; and
the portion of the input range comprised by the predefined test signal includes the respective conversion ranges of at least two of the converter stages.

17. The device for data conversion as claimed in claim 15, wherein the data converter is a successive approximation analog-to-digital converter, and wherein the range of design-specific maximum non-linearity comprises a value range involving switching of a most significant bit, MSB, or a second most significant bit, MSB-1.

18. A method, comprising:
generating a predefined test signal;
converting the predefined test signal using an analog-to-digital converter to generate a converted test signal;
determining a multiplicity of time-associated linearity parameters that describe a linearity of the analog-to-digital converter at a multiplicity of different times based on the converted test signal; and
comparing at least one linearity parameter of the multiplicity of time-associated linearity parameters with a comparison parameter; and
determining a state of the analog-to-digital converter based on the comparing.

19. The method of claim 18, wherein the predefined test signal comprises only a portion of an input range of the analog-to-digital converter, and the portion of the input range comprises a range of a design-specific maximum non-linearity.

20. The method of claim 18, further comprising shutting down the analog-to-digital converter based on the determined state.

* * * * *